United States Patent
Teng (10) Patent No.: US 6,242,156 B1
(45) Date of Patent: Jun. 5, 2001

(54) LITHOGRAPHIC PLATE HAVING A CONFORMAL RADIATION-SENSITIVE LAYER ON A ROUGH SUBSTRATE

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

(21) Appl. No.: 09/605,018

(22) Filed: Jun. 28, 2000

(51) Int. Cl.[7] .................................................. G03C 1/765
(52) U.S. Cl. ................................. 430/270.1; 430/273.1; 430/278.1; 430/286.1; 430/302; 430/303; 430/526; 101/454; 101/456; 101/457; 101/463.1
(58) Field of Search .......................... 430/270.1, 273.1, 430/278.1, 281.1, 286.1, 302, 303, 524, 526; 101/454, 456, 457, 467

(56) References Cited

U.S. PATENT DOCUMENTS

| | | | |
|---|---|---|---|
| 3,511,661 | 5/1970 | Rauner et al. ........................ 96/86 |
| 3,975,197 | * 8/1976 | Mikelsons ............................ 96/86 |
| 4,054,094 | 10/1977 | Caddell et al. ...................... 101/467 |
| 4,508,814 | 4/1985 | Sakurai et al. ...................... 430/303 |
| 4,655,136 | * 4/1987 | Reiss et al. ......................... 101/459 |
| 4,976,198 | * 12/1990 | Ohba et al. ......................... 101/459 |
| 5,187,046 | * 2/1993 | Patrick et al. ...................... 430/278 |
| 5,258,263 | 11/1993 | Cheema et al. ..................... 430/309 |
| 5,516,620 | 5/1996 | Cheng et al. ........................ 430/138 |
| 5,550,002 | * 8/1996 | Kojima et al. ....................... 430/258 |
| 5,677,110 | * 10/1997 | Chia et al. ........................... 430/302 |
| 5,728,503 | * 3/1998 | Dhillon et al. ....................... 430/158 |
| 5,834,129 | * 11/1998 | Dhillon et al. ....................... 428/654 |
| 5,858,604 | 1/1999 | Takeda et al. ....................... 430/162 |
| 5,879,861 | * 3/1999 | Van Damme et al. ............... 430/302 |
| 5,922,502 | 7/1999 | Damme et al. ...................... 430/162 |
| 6,014,929 | 1/2000 | Teng ................................... 101/456 |
| 6,071,675 | 6/2000 | Teng ................................... 430/302 |
| 6,182,569 | * 2/2001 | Rorke et al. ......................... 101/457 |

* cited by examiner

*Primary Examiner*—Mark F. Huff
*Assistant Examiner*—Barbara Gilmore (57) ABSTRACT

This invention discloses a lithographic plate comprising on a roughened substrate a substantially conformal radiation-sensitive layer. The radiation-sensitive layer can be a photo hardenable or photo solubilizable layer, or can be a laser ablatable layer. The radiation-sensitive layer is substantially conformally coated on the roughened substrate surface in a way so that the surface of the radiation-sensitive layer has peaks and valleys substantially corresponding to the major peaks and valleys of the substrate microscopic surface. The lithographic plate of such a configuration can provide no or low tackiness and excellent block resistance, while allowing excellent press durability. For on-press developable lithographic plate, such a plate configuration also allows excellent on-press developability.

18 Claims, 1 Drawing Sheet

LITHOGRAPHIC PLATE HAVING A CONFORMAL RADIATION-SENSITIVE LAYER ON A ROUGH SUBSTRATE

FIELD OF THE INVENTION

This invention relates to lithographic printing plates. More particularly, it relates to lithographic plates having on a roughened substrate a substantially conformally coated radiation-sensitive layer.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a radiation-sensitive coating deposited on the substrate, the substrate and the radiation-sensitive coating having opposite surface properties. The radiation-sensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask which is placed between the light source and the plate. With the advance of laser and computer technologies, laser sources have been increasingly used to directly expose a printing plate which is sensitized to a corresponding laser wavelength; photomask is unnecessary in this case.

The radiation-sensitive layer is generally coated onto a smooth or grained substrate at sufficient thickness to form a flat, smooth surface. While a plate with a flat, smooth radiation-sensitive layer are very useful, it often suffers from the problem that the radiation-sensitive layer surface tends to block to the back of another plate at extreme environmental condition, such as higher temperature, higher pressure, and higher humidity. Also, such a plate can suffer from higher tackiness when the radiation-sensitive layer is formulated with higher content of liquid components (such as monomers) or at higher humidity. Coating the radiation-sensitive layer on a grained substrate at a thin coverage so that the radiation-sensitive layer surface is below the top of the microscopic peaks of the grained substrate surface has been proposed in the patent literature; however, such a plate suffers from poor ink receptivity in the image areas and poor press durability due to incomplete coverage of the microscopic surface by the radiation-sensitive layer. Therefore, there is a desire for a lithographic plate which has excellent block resistance, non-tackiness, ink receptivity, and press durability.

Currently, most commercial lithographic plates require a development process after the plates being exposed and before put on press. A liquid developer is used to dissolve and clean off the non-exposed areas (for negative plate) or the exposed areas (for positive plates). Such a development process is time and labor consuming and generates wet waste. It would be desirable that such a tedious development process can be eliminated.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the on-press developable lithographic printing plates are U.S. Pat. Nos. 5,258,263, 5,407,764, 5,516,620, 5,561,029, 5,616,449, 5,677,110, 5,811,220, and 6,014,929. An on-press developable lithographic plate generally comprises, at least, a substrate and a radiation-sensitive layer. In order for an on-press developable plate to be useful, the non-hardened (for negative working plate) or the solubilized (for positive working plate) areas should be able to be cleaned off completely on press with ink (for waterless plate) or with ink and/or fountain solution (for wet plate) during the initial press operation. Acceptable printed sheets should be achieved within a few impressions. Therefore, the non-hardened or solubilized areas of the radiation-sensitive layer should be able to be penetrated, softened, and dispersed or dissolved by ink and/or fountain solution within seconds; the softened, and dispersed or dissolved areas of the radiation-sensitive layer will be absorbed by ink and/or fountain solution, and/or removed by the press offset roller and printing papers. Considering the limited amount of ink or fountain solution on a printing press and the high viscosity of the ink, it is very difficult to obtain a plate which is non-tacky and can be developed on press quickly and cleanly. Radiation-sensitive layer with fast ink and/or fountain solution penetrability and developability usually has poor non-tackiness and poor block resistance, compared to conventional plates. Here, block resistance is defined as the capability to resist the radiation-sensitive layer from transferring to the back of another plate when stacking many plates together. Therefore, there is a desire for an on-press developable lithographic printing plate with excellent non-tackiness, block resistance, on-press developability, and press durability.

Various laser ablatable plates have been described in the literature. Examples of such plates include U.S. Pat. Nos. 4,054,094, 5,605,780, 5,310,869, and 5,493,971. Such plates comprise, at least, a substrate and one or more laser ablatable radiation-sensitive layers on the substrate. During the imagewise exposure, infrared laser thermally ablates the radiation-sensitive layer (or layers) in the exposed areas to reveal the substrate, forming a plate consisting of substrate areas and coating areas in an imagewise distribution. Usually, a coating with the best ablation capability (requiring the least laser energy to achieve complete ablation) does not have the best block resistance, and a coating with best block resistance does not have the optimum ablation capability. There is a challenge to have both good ablation capability and block resistance.

I have found that a lithographic plate comprising on a roughened substrate a substantially conformally coated radiation-sensitive layer can provide no or low tackiness and excellent block resistance, while allowing excellent press durability. For on-press developable lithographic plate, such a radiation-sensitive layer configuration also allows excellent on-press developability. For laser ablatable lithographic plate, such a radiation-sensitive layer configuration also allows excellent ablatability. The radiation-sensitive layer is substantially conformally coated on the roughened substrate surface in a way so that the surface of the radiation-sensitive layer has peaks and valleys substantially corresponding to the major peaks and valleys of the substrate microscopic surface. It is very surprising that such a plate surface gives very low tackiness and excellent block resistance even with a radiation-sensitive layer which is very tacky and has poor block resistance when coated to form a smooth surface. It is also very surprising that such a thin coating (especially in the peak areas) can still provide excellent press durability.

SUMMARY OF THE INVENTION

It is an object of the present invention to provide a lithographic printing plate with no or low tackiness and good block resistance while maintaining excellent press durability.

It is another object of the present invention to provide an on-press developable lithographic printing plate with no or low tackiness and good block resistance while maintaining excellent on-press developability and press durability.

It is another object of the present invention to provide laser ablatable lithographic printing plate with no or low tackiness and good block resistance while maintaining excellent ablatability and press durability.

It is yet another object of the present invention to provide a lithographic plate comprising on a roughened substrate a substantially conformally coated radiation-sensitive layer in order to achieve reduced tackiness or good block resistance, while allowing excellent press durability.

Further objects, features and advantages of the present invention will become apparent from the detailed description of the preferred embodiments.

According to the present invention, there has been provided a lithographic printing plate, comprising:

(a) a substrate with roughened surface on at least one side, said surface comprising, at least, peaks and valleys; and (b) a radiation-sensitive layer on said substrate, said radiation-sensitive layer being capable of hardening or solubilization upon exposure to an actinic radiation or capable of thermal ablation upon exposure to a laser radiation, and exhibiting an affinity or aversion substantially opposite to the affinity or aversion of said substrate to at least one printing liquid selected from the group consisting of ink and an abhesive fluid for ink; wherein said radiation-sensitive layer is substantially conformally coated on the substrate surface so that the surface of the radiation-sensitive layer has peaks and valleys substantially corresponding to the major peaks and valleys of the substrate microscopic surface.

According to another aspect of the present invention, there has been provided a method of lithographically printing images on receiving media, comprising in order:

(a) providing a lithographic printing plate comprising (i) a substrate with roughened surface on at least one side, said surface comprising, at least, peaks and valleys; and (ii) a radiation-sensitive layer on said substrate, said radiation-sensitive layer being capable of hardening or solubilization upon exposure to an actinic radiation, the non-hardened or solubilized areas of said radiation-sensitive layer being soluble or dispersible in ink (for waterless plate) or in ink and/or fountain solution (for wet plate), and said radiation-sensitive layer exhibiting an affinity or aversion substantially opposite to the affinity or aversion of said substrate to at least one printing liquid selected from the group consisting of ink and an abhesive fluid for ink; wherein said radiation-sensitive layer is substantially conformally coated on the substrate surface so that the surface of the radiation-sensitive layer has peaks and valleys substantially corresponding to the major peaks and valleys of the substrate microscopic surface.

(b) exposing the plate with an actinic radiation to cause hardening or solubilization of the exposed areas; and (c) contacting said exposed plate with ink (for waterless plate), or with ink and/or fountain solution (for wet plate) on a printing press to develop the radiation-sensitive layer, and to lithographically print images from said plate to the receiving media.

DETAILED DESCRIPTION OF THE PREFERRED EMBODIMENTS

Plate Constructions

The present invention provides lithographic printing plates (FIG. 1) with a roughened substrate having, at least, peaks and valleys (10), and a thin radiation-sensitive layer (20) which is substantially conformally coated on the roughened substrate surface so that the surface of the radiation-sensitive layer has peaks and valleys substantially corresponding to the major peaks and valleys of the substrate microscopic surface. The radiation-sensitive layer is capable of hardening (negative-working) or solubilization (positive-working) upon exposure to an actinic radiation, or is capable of removal through thermal ablation upon exposure to laser radiation. For on-press developable plate, the radiation-sensitive layer must be soluble or dispersible in ink and/or fountain solution.

Figure 1:
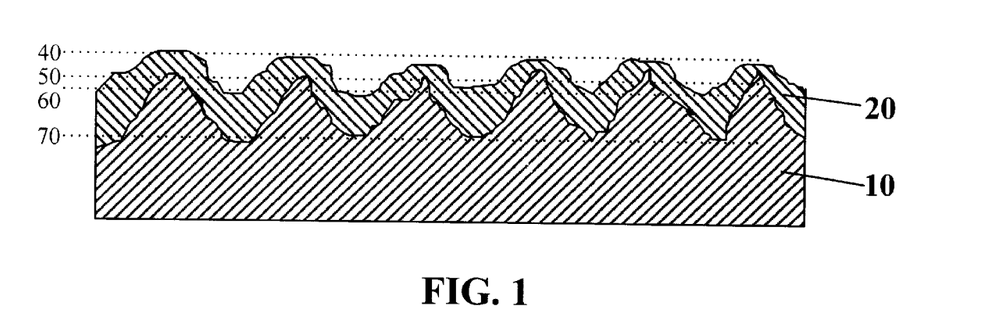
FIG. 1 is a diagrammatic cross-section view of a lithographic printing plate of the invention. The plate comprises a substrate with roughened surface (10) having, at least, peaks and valleys, and a radiation-sensitive layer (20) which is substantially conformally coated on the roughened substrate surface so that the surface of the radiation-sensitive layer has peaks and valleys substantially corresponding to the major peaks and valleys of the substrate microscopic surface.

As shown in FIG. 1, the substrate microscopic surface is substantially fully covered by the radiation-sensitive layer, and the radiation-sensitive layer surface has raised microscopic peaks and lower microscopic valleys. In a preferred configuration, the substrate has an average surface roughness Ra of about 0.2 to about 2.0 micrometer, the radiation-sensitive layer has a coverage of about 0.1 to about 2.0 g/m$^2$, and the average height of the valleys on the radiation-sensitive layer surface (60) is at least 0.1 micrometer below the average height of the peaks of radiation-sensitive layer surface (40). In another preferred configuration, the average height of the valleys on the radiation-sensitive layer surface (60) is below the average height of the peaks on the substrate surface (50).

Lithographic printing plate constructions covered in this invention include, but are not limited to, (a) a wet plate with a hydrophilic substrate and an oleophilic radiation-sensitive layer; (b) a wet plate with an oleophilic substrate and a hydrophilic radiation-sensitive layer; (c) a waterless plate with an oleophilic substrate and an oleophobic radiation-sensitive layer; and (d) a waterless plate with an oleophobic substrate and an oleophilic radiation-sensitive layer. A preferred wet plate comprises a hydrophilic substrate and an oleophilic radiation-sensitive layer. A preferred waterless plate comprises an oleophilic substrate and an oleophobic radiation-sensitive layer. The radiation-sensitive layer can be a single layer, or can consists of more than one sublayers of different compositions. For example, for thermal ablatable plate, the radiation-sensitive layer can consist of a more infrared light-absorbing ablatable inner layer and a less or non infrared light-absorbing outer layer; for actinic light sensitive plate, the radiation-sensitive layer can consist of two photosensitive sublayers as describe in U.S. Pat. No. 5,476,754.

Figure 2:
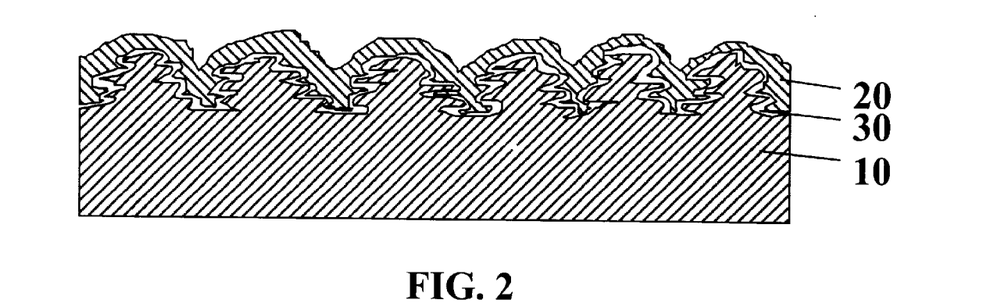
FIG. 2 is a diagrammatic cross-section view of another lithographic printing plate of the invention. The plate comprises a substrate with roughened surface (10) having, at least, peaks and valleys, a thin releasable interlayer (30), and a radiation-sensitive layer (20) which is substantially conformally coated on the roughened substrate surface so that the surface of the radiation-sensitive layer has peaks and valleys substantially corresponding to the major peaks and valleys of the substrate microscopic surface; wherein the substrate surface is rough and/or porous enough and the interlayer is thin enough to allow bonding between the radiation-sensitive layer and the substrate through mechanical interlocking.

For plates with rough and/or porous hydrophilic surface capable of mechanical interlocking with a coating deposited thereon (FIG. 2), a thin releasable (such as water-soluble) interlayer (30) as described in U.S. Pat. No. 6,014,929, the entire disclosure of which is hereby incorporated by reference, may be deposited between the substrate (10) and the radiation-sensitive layer (20), wherein the substrate surface is rough and/or porous enough and the interlayer is thin enough to allow bonding between the radiation-sensitive layer and the substrate through mechanical interlocking. Here, the radiation-sensitive layer is substantially conformally coated on the releasable interlayer with the peaks and valleys on the radiation-sensitive layer surface corresponding to the major peaks and valleys of the releasable interlayer coated substrate.

For actinic light sensitive plate, a water and/or ink soluble or dispersible, non-radiation-sensitive overcoat may be further coated on top of the radiation-sensitive layer to, for example, retard oxygen inhibition and provide surface durability. A laser ablatable mask layer can be further coated onto the radiation-sensitive layer, wherein the top laser ablatable mask layer should be sensitive to a certain radiation (wavelength) to which the actinic light sensitive radiation-sensitive layer is not sensitive. The mask layer can be a single layer, or can consists of more than one sublayers of different compositions, such as an infrared laser-absorbing ablatable inner sublayer and an actinic radiation (non-infrared radiation in this case)-absorbing outer sublayer. The laser imaged plate is further flood exposed with a radiation (such as UV light) to either harden (for negative-working plate) or solubilize (for positive-working plate) the actinic radiation-sensitive layer. The laser ablatable mask layer is preferably developable with the developer for the radiation-sensitive layer so that a single step for mask layer removal and radiation-sensitive layer development can be carried out.

For actinic light sensitive plate having fountain solution and/or ink soluble or dispersible radiation-sensitive layer, a fountain solution and/or ink soluble or dispersible, non-radiation-sensitive overcoat may be further coated on top of the radiation-sensitive layer to, for example, retard oxygen inhibition and provide surface durability. A water and/or ink soluble or dispersible, laser ablatable or bleachable mask layer (as a single layer or combination of more than one sublayers) can be further coated onto the radiation-sensitive layer, wherein the top laser ablatable or bleachable layer should be sensitive to a certain radiation (wavelength) to which the actinic light sensitive radiation-sensitive layer is not sensitive. The laser imaged plate is further flood exposed with an actinic radiation to either harden or solubilize the actinic radiation-sensitive layer.

Substrate

The substrate employed in the lithographic plates of this invention can be any lithographic substrate which has roughened surface. Here the roughened surface is defined as a surface having microscopic, non-smooth structures on the whole surface (for the roughened side). Such microscopic structures include, regular or irregular, peaks and valleys, pores, and holes. Such a support may be a metal sheet, a polymer film, or a coated paper.

Roughened aluminum (including aluminum alloys) sheets are preferred metal supports. Particularly preferred is an aluminum support which has been grained, anodized, and deposited with a barrier layer. Surface roughening (or called graining) can be achieved by mechanical graining or brushing, chemical etching, and/or electrochemical graining. The roughened surface can be further anodized to form a durable aluminum oxide surface using an acid electrolyte such as sulfuric acid and/or phosphoric acid. For wet lithographic plate with hydrophilic substrate, the roughened and anodized aluminum surface can be further thermally or electrochemically coated with a layer of silicate or hydrophilic polymer such as polyvinyl phosphonic acid, polyacrylamide, polyacrylic acid, polybasic organic acid, and copolymers of vinyl phosphonic acid and acrylamide to form a durable hydrophilic layer. Processes for coating a hydrophilic barrier layer on aluminum in lithographic printing plate application are well known in the art, and examples can be found in U.S. Pat. Nos. 2,714,066, 4,153,461, 4,399,021, and 5,368,974. For waterless plate with oleophilic substrate, the anodized substrate can be directly used or can be further coated with an oleophilic sublayer.

Polyester sheet is the commonly used polymeric plate support. For wet lithographic plate with hydrophilic substrate, a hydrophilic sublayer is deposited on the substrate surface. For waterless lithographic plate with oleophilic substrate, the polyester substrate can be directly used or can be further coated with an oleophilic polymeric sublayer. The polyester substrate must have roughened surface in order to be useful for the current invention.

It is noted that, in order to be useful for the application of this invention, the barrier layer or sublayer coated substrate surface must have roughened structures. This barrier layer or sublayer is permanently attached to the support surface and forms the substrate surface of the processed plate.

The roughness of a surface can be expressed as average surface roughness Ra which is the average deviation of the "peaks" and "valleys" from the centerline and is also called arithmetical roughness average. Generally the substrate can have an average surface roughness Ra of about 0.2 to about 2.0 micrometer, and preferably about 0.4 to about 1.0 micrometer.

Actinic Light Sensitive Radiation-Sensitive Layer

For preparing actinic light sensitive plates of the current invention, any radiation-sensitive layer is suitable which is capable of hardening or solubilization in the exposed areas (and not in the unexposed areas) upon exposure to a radiation and any necessary overall treatment (including heating, chemical treatment or overall exposure with a different radiation). Here hardening means becoming insoluble in a developer (negative-working) and solubilization means becoming soluble in a developer (positive-working). For on-press developable plates, the developer can be ink and/or fountain solution. The radiation can be a conventional light source, such as a high pressure mercury lamp, a xenon lamp, or a fluorescence lamp (usually requiring a mask), or can be a laser source which directly images according to digital imaging information.

Radiation-sensitive materials useful in negative-working wet plates include silver halide emulsions, as described in U.S. Pat. No. 5,620,829 and references noted therein; polycondensation products of diazonium salts, as described in U.S. Pat. Nos. 3,679,416, 3,867,147, and 4,631,245 and references noted therein; compositions comprising acrylic monomers, polymeric binders, and photoinitiators, as described in U.S. Pat. Nos. 5,407,764 and 4,772,538 and references noted therein; light-sensitive compositions comprising polyfunctional vinyl ethers or epoxy monomers, and cationic photoinitiators, as described in U.S. Pat. Nos. 4,593,052 and 4,624,912 and references noted therein; cinnamal-malonic acids and functional equivalents thereof and others described in U.S. Pat. No. 3,342,601 and references noted therein; dual layer light sensitive materials described in U.S. Pat. No. 5,476,754; and compositions sensitized to both conventional ultraviolet and infrared laser radiations, as described in U.S. Pat. No. 5,491,046 and references noted therein.

Radiation-sensitive materials useful in positive-working wet plates include diazo-oxide compounds such as benzoquinone diazides and naphthoquinone diazides, as described in U.S. Pat. No. 4,141,733 and references noted therein; and compositions comprising a photo acid generator and a polymer having acid labile groups, as described in U.S. Pat. No. 5,395,734 and references noted therein.

Radiation-sensitive oleophobic materials useful in waterless plates include compositions comprising polymers having perfluoroalkyl groups and crosslinkable terminal groups, as described in U.S. Pat. Nos. 4,074,009 and 5,370,906 and references therein; compositions comprising polysiloxane and crosslinkable resins, as described in U.S. Pat. No. 4,259,905 and references therein; and compositions comprising a diazonium salt and an abhesive acid or salt thereof, as described in U.S. Pat. No. 3,997,349 and references noted therein.

It is noted that lithographic printing plates suitable for exposure with a conventional actinic light source through a photo mask can also be directly imagewise exposed with a laser having similar actinic wavelength. Because of the easy availability of certain visible and infrared lasers, such as argon laser 488 nm), frequency-doubled Nd/YAG laser (532 nm), diode laser (830 nm) and Nd/YAG laser (1064 nm), plates for laser imaging are often sensitized to the wavelength of one of these lasers. For example, some visible light sensitive initiators, such as Irgacure 784 (a free-radical initiator with strong absorption from 400 to 535 nm, from Ciba Geigy), can be used to formulate into the radiation-sensitive layer to make the plate imagable with argon laser or frequency-doubled Nd/YAG laser; an acid crosslinkable radiation-sensitive layer with addition of an infrared dye having strong absorption at about 830 nm and a thermo-sensitive latent Bronsted acid can be exposed with diode laser (usually followed by thermal treatment) to cause hardening in the exposed areas. Examples of such radiation-sensitive layers can be found in U.S. Pat. Nos. 4,486,529, 5,663,037, 5,491,046 and 5,641,608, and references noted therein.

The mechanisms for the photohardening or photosolubilization of radiation-sensitive materials may be different for different radiation-sensitive materials and imaging radiation. For example, a certain radiation can directly cause hardening or solubilization of a certain molecule; a certain radiation can activate a certain initiator (and/or coinitiator or sensitizer) which in turn causes hardening or solubilization of a certain molecule; and a certain radiation (usually an infrared light) can be absorbed by a absorbing dye or pigment to generate heat which heat in turn indirectly (through an initiator) or directly causes hardening or solubilization of a certain molecule. It is noted that, in order to clarify and simplify the terminology of this patent, in this patent, any radiation which can directly or indirectly cause hardening or solubilization of a radiation-sensitive material is defined as actinic radiation for that radiation-sensitive material. Such a radiation can be a conventional light or laser.

In a preferred embodiment as for negative-working wet lithographic printing plates of this invention, the radiation-sensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one radiation-sensitive free-radical initiator (including sensitizer), and other additives such as surfactant, dye or pigment, radiation exposure-indicating dye (such as leuco crystal violet, azobenzene, 4-phenylazodiphenylamine, and methylene blue dyes), and free-radical stabilizer (such as methoxyhydroquinone). Suitable polymeric binders include polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehye, and butadiene/acrylonitrile copolymer. Suitable free-radical polymerizable monomers (including oligomers) include multifunctional acrylate monomers or oligomers, such as acrylate and methacrylate esters of ethylene glycol, trimethylolpropane, pentaerythritol, ethoxylated ethylene glycol and ethoxylated trimethylolpropane, multifunctional urethanated acrylate and methacrylate (such as Sartomer CN970 and CN975 from Sartomer Company, Exton, Pa.), and epoxylated acrylate or methacrylate (such as Sartomer CN104 and CN120 from Sartomer Company, Exton, Pa.), and oligomeric amine diacrylates. Suitable radiation-sensitive free-radical initiators include the derivatives of acetophenone (such as 2,2-dimethoxy-2-phenylacetophenone, and 2-methyl-1-[4-(methylthio)phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, s-triazine (such as 2,4-bis(trichloromethyl)-6-(1-(4-methoxy) naphthyl)-1,3,5-triazine), and titanocene (bis($\eta^9$-2,4-cyclopentadien-1-yl), bis[2,6-difluoro-3-(1H-pyrrol-1-yl) phenyl)titanium).

In a second preferred embodiment as for negative-working wet lithographic printing plates of this invention, the radiation-sensitive layer comprises a polycondensation product of diazonium salt (diazo resin), with or without a polymeric binder, and other additives such as colorants, stabilizers, exposure indicators, surfactants and the like. Particularly useful diazo resins include, for example, the condensation product of p-diazodiphenylamine and formaldehyde, the condensation product of 3-methoxy-4-diazodiphenylamine and formaldehyde, and the diazo resins of U.S. Pat. Nos. 3,867,147, 4,631,245 and 5,476,754, and references noted therein. Particularly useful polymeric binders for use with such diazo resins include, for examples, acetal polymers and their derivatives as described in U.S. Pat. Nos. 4,652,604, 4,741,985, 4,940,646, 5,169,897 and 5,169,898, and references noted therein; and polymeric binders with carboxylic acid groups, as described in U.S. Pat. No. 4,631,245.

In another preferred embodiment as for negative-working wet lithographic printing plates of this invention, the radiation-sensitive layer comprises at least one polyfunctional vinyl ether or epoxy monomer (or oligomer), at least one cationic photoinitiator (including sensitizer), optionally one or more polymeric binders, and other additives such as colorants, stabilizers, exposure indicators, surfactants and the like. Examples of useful polyfunctional epoxy monomers are 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin. Examples of useful cationic photoinitiators are triarylsulfonium hexafluoroantimonate and triarylsulfonium hexafluorophosphate. Examples of useful polymeric binders are polybutylmethacrylate, polymethylmethacrylate and cellulose acetate butyrate.

In order to be useful for the on-press developable plate of this invention, the radiation-sensitive layer must be capable of hardening or solubilization upon exposure to an actinic radiation, and the non-hardened (for negative-working plate) or solubilized (for positive-working plate) areas of the radiation-sensitive layer must be soluble or dispersible in ink and/or fountain solution and can therefore be developed off on a lithographic press with ink and/or fountain solution. Various on-press developable radiation-sensitive layers have been disclosed in the patent literature and can be used for preparing the on-press developable plate of this invention. Patents describing on-press developable radiation-sensitive layer include, for example, U.S. Pat. Nos. 5,516,620, 5,677,108, 5,776,654, 5,811,220, 5,997,993, 6,014,929, 6,071,675, and 6,027,857.

On-press developable plate is usually exposed on an exposure device, and then mounted on press to develop with ink and/or fountain solution and then print out regular printed sheets. However, the plate can also be exposed on a printing press cylinder, and the exposed plate can be directly developed on press with ink and/or fountain solution and then print out regular printed sheets.

The radiation-sensitive layer should have a coverage thin enough to allow formation of substantially conformal coating on the rough substrate surface but thick enough to allow sufficient durability. The actinic radiation-sensitive layer preferably has a coverage of less than 2.0 g/m$^2$, and more preferably from 0.2 to 1.0 g/m$^2$.

Laser Ablatable Radiation-Sensitive Layer

In order to be useful for the ablatable plate of this invention, the radiation-sensitive layer must be capable of ablation upon exposure to an infrared laser radiation at sufficient dosage. The surface of the radiation-sensitive layer (or the top radiation-sensitive layer, for plates with more than one radiation-sensitive layer) must have an affinity or aversion substantially opposite to the affinity or aversion of the substrate to at least one printing liquid selected from the group consisting of ink and an abhesive fluid for ink.

For forming an infrared laser ablatable radiation-sensitive layer, any materials are suitable, which are capable of being removed upon infrared laser exposure. Examples of such materials include a dispersion of metal particles, carbon black, infrared dye, or infrared pigment in a polymeric matrix, a thin layer of metal (including metal alloy), or metal oxide, and a coating of conductive polymer. Dispersed silver is an example of dispersed metal particles. The ablatable radiation-sensitive layer can be a single layer or can consist of two or more sublayers, as long as the combined sublayers can be removed all together upon infrared laser exposure. For example, there can be an inner infrared laser ablatable metal layer, and an outer polymer layer (with or without infrared light absorber). The ablatable radiation-sensitive layer, or the sublayers within the radiation-sensitive layer, can be deposited from a solution or dispersion, or by vapor deposition.

Various metals (including metal alloys), metal oxides, and metal sulfides can be used to form the ablatable radiation-sensitive layer or sublayer of this invention. Examples of metals, metal oxides, and metal sulfides useful as mask layer or mask sublayer include aluminum, alloys of aluminum, aluminum oxide, titanium, alloys of titanium, nickel, iron, chromium, and copper. Examples of laser ablatable metallic layers have been described in U.S. Pat. Nos. 5,171,650, 5,379,698, and RE35512, the entire disclosures of which are hereby incorporated by reference. Examples of laser ablatable layer consisting of metal oxide or metal sulfide, are described in U.S. Pat. No. 5,308,737. The metallic layers can be deposited by vapor deposition, electrochemical deposition, and other means. Vapor deposition is a preferred method. The metal, metal alloy, metal oxide, and metal sulfide can be vapor deposited using, for example, resistance heater, sputtering, and electron beam techniques under vacuum. The techniques for deposition of metal, metal alloy, metal oxide, and metal sulfide are well known, and are described in, for example, U.S. Pat. No. 4,430,366 and the book Vacuum Deposition of Thin Films (L. Holland, 1970, Chapman and Hall, London, England). The thickness of the metal and/or metal oxide layer should be preferably less than 200 Å, and more preferably between 30 and 100 Å. The optical density of the metal and/or metal oxide layer should be preferably less than 3.0, and more preferably between 0.2 to 1.0. In addition to metal, metal alloy, metal oxide, and metal sulfide, certain polymers, organic compounds, and inorganic compounds can also be vapor deposited.

For ablatable radiation-sensitive layer or sublayer deposited by conventional coating method, the depositing solution or dispersion may be an aqueous or solvent solution or dispersion. A solvent, aqueous alkaline or water soluble or dispersible binder may be used. Various additives may be added in the radiation-sensitive layer to enhance certain properties of the plate. Such additives include surfactant, dispersing agent, coalescing agent (for polymeric dispersion), infrared light absorbing dye or pigment, ultraviolet light absorbing dye or pigment, plasticizer, and thermal ablation-enhancing materials (such as gas-generating compounds). The radiation-sensitive layer may contain one or more infrared light absorbing dye or pigment. The thickness of the radiation-sensitive layer is preferably chosen so that suitable infrared laser sensitivity, press durability, and substantially conformal coating on the substrate microscopic surface structures are obtained. The polymer based ablatable radiation-sensitive layer preferably has a coverage of less than 2.0 g/m$^2$, and more preferably from 0.2 to 1.0 g/m$^2$.

Infrared laser useful for imagewise exposure for the mask layer include laser sources emitting in the infrared region, i.e. emitting in the wavelength range of above 700 nm, preferably 700–1500 nm. Particularly preferred infrared laser sources are laser diodes emitting around 830 nm or a NdYAG laser emitting around 1060 nm.

Infrared laser imaging devices are currently widely available commercially. Any device can be used which provides imagewise infrared laser exposure according to digital image information. Commonly used imaging devices include flatbed imager, internal drum imager, and external drum imager. Internal drum imager and external drum imager are preferred imaging devices. A vacuum filtering device may be attached next to the laser head to collect and filter out the debris from the ablated mask layer. A transparent polymeric film may be laminated to the ablatable layer side of the laser ablatable plate to collect the ablated debris; after imaging, the polymeric film is separated from the plate.

The laser ablatable plate can be exposed on an exposure device and then, with or without further process (such as cleaning or gumming), mounted on press for printing or for process and printing. Alternatively, the plate can be exposed on the plate cylinder of a printing press and then, with or without further process, directly printed on the same press cylinder.

The invention is further illustrated by the following examples of its practice. Unless specified, all the values are by weight.

EXAMPLE 1

This example demonstrates that a lithographic plate having on a roughened substrate a substantially conformally coated radiation-sensitive layer can provide better block resistance and lower tackiness, while allowing excellent developability and durability.

An electrochemically roughened, anodized, and sodium silicate treated aluminum sheet was used as the plate substrate, which has Ra of about 0.6 micrometer. The aluminum substrate was coated using a #5 Meyer rod with a radiation-sensitive layer PS-1 to achieve a dry coverage of about 0.5 g/m$^2$, followed by drying in an oven at 70° C. for 8 min.

| Formulation PS-1 | Weight (g) |
| --- | --- |
| Neocryl B-728 polymer (from Zeneca) | 12.02 |
| Ebecryl RX8301 oligomer (from UCB Chemicals) | 3.21 |
| Sartomer SR-399 monomer (from Sartomer) | 20.04 |
| Irgacure 907 initiator (from Ciba-Geigy) | 1.60 |
| Isopropyl thioxanthone (Sensitizer) | 0.80 |
| Methoxyether hydroquinone (Antioxidant) | 0.04 |
| Irganox 1035 antioxidant (from Ciba Geigy) | 0.04 |
| Orasol Blue GN dye (from Ciba Geigy) | 0.32 |
| Leuco crystal violet (Exposure indicator) | 0.32 |
| Pluronic L43 surfactant (from BASF) | 1.60 |
| Cyclohexanone | 40.0 |
| Methylethylketone | 320.0 |

A piece of the plate prepared above was evaluated by hand for tackiness. The plate was also tested for block resistance by stacking 4 pieces of the plate (4 inches by 4 inches) together with the coating side of the plate facing the back of the plate under a 10 pounds weight for 24 hours. Another piece of the above plate was placed under a negative lithographic mask and exposed to a UV light with an emission peak at about 364 nm for 2 min. using an INSTANT 2 VACUUM PRINTER 24×28 exposure device (manufactured by Berkey Technical Co., New York). The plate was then rubbed 10 times with a cloth dampened with both fountain solution (prepared from Superlene Brand All Purpose Fountain Solution Concentrate made by Varn, Oakland, N.J.) and ink (Sprinks 700 Acrylic Black ink from Sprinks Ink, Fla.) to check on-press developability and inking; additional 200 rubs (Each back-and-forth counts as one rub.) were performed to check the durability of the plate. This plate showed low tackiness, good block resistance (no sticking together and no coating transfer to the back of another plate), good on-press developability, and good durability.

Another plate which was prepared and exposed as above was tested on a wet lithographic press (Multilith Model 1250W from Multigraph Corporation, Chicago). The exposed plate was directly mounted on the plate cylinder of the press, rotated with fountain solution for 3 rotations, rotated with ink for 10 rotations, and then engaged with the blanket cylinder and printed with papers. Under 10 impressions, the printed sheets showed good imaging and clean background. The plate continued to run for a total of 10,000 impressions without showing any wearing or other defects.

In order to identify the surface configuration of the radiation-sensitive layer, a piece of fully exposed plate (with fully hardened, blue colored radiation-sensitive layer) was examined under an optical microscope for the radiation-sensitive layer surface. Under microscope, the radiation-sensitive layer surface showed microscopically roughened structures, with microscopic peaks and valleys, and the blue-colored radiation-sensitive layer fully covered the substrate surface, including the tips of the peaks. This fully hardened radiation-sensitive layer surface of the plate was also checked for surface roughness (or smoothness) by both gently scratching with finger nail and rubbing with fingers; this hand test indicated that the radiation-sensitive layer had rough surface. The fully exposed areas of the plate were further rubbed with a cloth dampened with both fountain solution and ink to ink up the radiation-sensitive layer covered areas and clean up any bare substrate areas. Microscope examination of the inked plate indicated that the fully exposed areas were completely covered with ink, also indicating that the substrate surface of the plate was microscopically fully covered with radiation-sensitive layer. The facts that the substrate surface is microscopically fully covered by radiation-sensitive layer and that the radiation-sensitive layer coated plate surface has rough surface structures indicate that the radiation-sensitive layer is substantially conformally coated on the roughened substrate surface.

EXAMPLE 2

Comparative Example for EXAMPLE 1

This example illustrates that a plate with smooth, flat surface has higher tackiness and poorer block resistance. Here the radiation-sensitive layer has higher coverage.

In this example, the substrate and the radiation-sensitive layer were the same as in EXAMPLE 1 except that the radiation-sensitive layer was coated at higher coverage (with a #10 Meyer rod) to form a flat and smooth surface.

The plate obtained was evaluated with the same procedures as in Example 1. Inspection in the fully exposed areas of the plate showed very flat and smooth surface. The plate showed high tackiness, poor block resistance, and poor on-press developability.

EXAMPLE 3

Comparative Example for EXAMPLE 1

This example also illustrates that a plate with smooth, flat surface has higher tackiness and poorer block resistance. Here the substrate has lower surface roughness.

In this example, the plate was prepared the same as in EXAMPLE 1 except that the substrate was a smoothly grained, anodized aluminum with a Ra of less than 0.2 micrometer.

The plate obtained was evaluated with the same procedures as in Example 1. Inspection in the fully exposed areas of the plate showed very flat and smooth surface. The plate showed high tackiness and poor block resistance.

EXAMPLE 4

In this example, the plate was prepared the same as in EXAMPLE 1 except that a thin water-soluble interlayer was interposed between the substrate and the radiation-sensitive layer.

An electrochemically roughened, anodized, and sodium silicate treated aluminum substrate was first coated with a 0.2% aqueous solution of Airvol 540 using a #6 Meyer rod, followed by drying in an oven at 100° C. for 5 min. The polyvinyl alcohol coated substrate was further coated with the radiation-sensitive layer formulation PS-1 using a #5 Meyer rod, followed by drying in an oven at 70° C. for 8 min.

The plate obtained was evaluated with the same procedures as in Example 1. Inspection in the fully exposed areas of the plate showed microscopically roughened surface, with microscopic peaks and valleys. The plate showed low tackiness, good block resistance, good on-press developability, and good durability.

EXAMPLE 5

In this example, the plate was prepared the same as in EXAMPLE 1 except that a pigmented radiation-sensitive layer PS-2 was used.

| Formulation PS-2 | Weight (g) |
| --- | --- |
| Neocryl B-728 polymer (from Zeneca) | 12.0 |
| Ebecryl RX8301 oligomer (from UCB Chemicals) | 3.21 |
| Sartomer SR-399 monomer (from Sartomer) | 20.0 |
| Irgacure 907 initiator (from Ciba-Geigy) | 1.60 |
| Isopropyl thioxanthone (Sensitizer) | 0.80 |
| Methoxyether hydroquinone (Antioxidant) | 0.04 |
| Irganox 1035 antioxidant (from Ciba Geigy) | 0.04 |
| Microlith Blue 4G-K pigment dispersion (from Ciba Geigy) | 0.32 |
| Leuco crystal violet (Exposure indicator) | 0.32 |
| Pluronic L43 surfactant (from BASF) | 1.60 |

| Formulation PS-2 | Weight (g) |
| --- | --- |
| Cyclohexanone | 40.0 |
| Methylethylketone | 360.0 |

The plate obtained was evaluated with the same procedures as in Example 1. Inspection in the fully exposed areas of the plate showed microscopically roughened surface, with microscopic peaks and valleys. The plate showed low tackiness, good block resistance, good on-press developability, and good durability.

EXAMPLE 6

In this example, the plate was prepared the same as in EXAMPLE 1 except that a electrochemically roughened, anodized, and polyvinylphosphonic acid treated aluminum substrate (Ra=about 0.6 micrometer) was used.

The plate obtained was evaluated with the same procedures as in Example 1. Inspection in the fully exposed areas of the plate showed microscopically roughened surface, with microscopic peaks and valleys. The plate showed low tackiness, good block resistance, good on-press developability, and good durability.

EXAMPLE 7

In this example, the plate was prepared the same as in EXAMPLE 1 except that a mechanically roughened, anodized, and silicate treated aluminum substrate (Ra=about 0.5 micrometer) was used.

The plate obtained was evaluated with the same procedures as in Example 1. Inspection in the fully exposed areas of the plate showed microscopically roughened surface, with microscopic peaks and valleys. The plate showed low tackiness, good block resistance, good on-press developability, and good durability.

EXAMPLE 8

This example illustrates a lithographic plate having on a roughened substrate a thin conformally coated infrared laser ablatable radiation-sensitive layer.

The infrared laser ablatable radiation-sensitive layer formulation PS-3 was coated onto a mechanically roughened, anodized, and polyvinyl phosphonic acid treated aluminum substrate (Ra=about 0.6 micrometer) using a #5 Meyer rod, followed by drying in an oven at 70° C. for 8 min.

| Formulation PS-3 | Weight (g) |
| --- | --- |
| Epon-1301 (Epoxy resin from Shell Chemicals) | 3.7 |
| Cyracure UVR-6110 (Epoxy compound from Union Carbide) | 5.9 |
| Cyracure UVI-6974 (Cationic initiator from Union Carbide) | 1.2 |
| Microlithoblack C-K (Carbon black disperison from Ciba-Geigy) | 5.7 |
| Methylethylketone | 183.5 |

The plate obtained was tested for block resistance by stacking 4 pieces of plate (4 inches by 4 inches) together with the coating side of the plate facing the back of the plate under a 10 pounds weight for 24 hours. Good block resistance (no sticking together and no coating transfer to the back of another plate) was observed.

The above plate was exposed with an infrared laser plate imager equipped with laser diodes (8-channels, about 500 mW each) emitting at 830 nm with a laser size of about 15 micrometer. The plate was placed on the imagine drum (external drum with a circumference of 1 meter) and secured with vacuum and master tapes. The exposure dosage was controlled by the drum speed. The plate was exposed at a laser dosage of about 500 mJ/cm$^2$ to substantially remove the mask layer in the exposed areas by thermal ablation. The laser imaged plate was baked at 200° C. for 5 min. to harden the non-ablated areas. The plate showed laser exposed background areas and the non-ablated ink receiving areas. Microscope and hand inspections in the fully cured non-exposed areas of the plate showed microscopically roughened surface (with microscopic peaks and valleys) which is fully covered by the ablatable radiation-sensitive layer.

EXAMPLE 9

Comparative Example for EXAMPLE 8

This example illustrates that a plate with smooth, flat surface has poorer block resistance and higher tackiness.

In this example, the plate was prepared the same as in EXAMPLE 8 except that the substrate was an anodized aluminum having smooth surface. The plate was evaluated with the same procedures as in EXAMPLE 8. The non-exposed, uncured plate showed poor block resistance and was much tackier than the plate of EXAMPLE 8. Microscope and hand inspections in the fully cured non-exposed areas of the plate showed microscopically flat, smooth surface of the ablatable radiation-sensitive layer.

I claim:
1. A lithographic printing plate, comprising:
    (a) a substrate with roughened surface on at least one side, said surface comprising, at least, peaks and valleys; and
    (b) a radiation-sensitive layer on said substrate, said radiation-sensitive layer being capable of hardening or solubilization upon exposure to an actinic radiation or capable of thermal ablation upon exposure to a laser radiation, and exhibiting an affinity or aversion substantially opposite to the affinity or aversion of said substrate to at least one printing liquid selected from the group consisting of ink and an abhesive fluid for ink; wherein said radiation-sensitive layer is substantially conformally coated on the substrate surface so that the surface of the radiation-sensitive layer has peaks and valleys substantially corresponding to the major peaks and valleys of the substrate microscopic surface; and said substrate has an average surface roughness Ra of about 0.2 to about 2.0 microns, the radiation-sensitive layer has a coverage of about 0.1 to about 2.0 g/m$^2$, and the average height of the valleys on the radiation-sensitive layer surface is at least 0.1 microns below the average height of the peaks of radiation-sensitive layer surface.

2. The lithographic plate of claim 1 wherein the average height of the valleys on the radiation-sensitive layer surface is below the average height of the peaks on the substrate surface.

3. The lithographic plate of claim 1 further including a releasable interlayer interposed between the radiation-sensitive layer and the roughened substrate, wherein said roughened substrate is capable of mechanical interlocking with a coating deposited thereon, said releasable interlayer is substantially conformally coated on the substrate microscopic surface and is thin enough in thickness to allow mechanical interlocking between the radiation-sensitive layer and the substrate, and said releasable interlayer is soluble or dispersible in a liquid selected from the group consisting of water, fountain solution, ink, aqueous and solvent plate developers, organic solvents, and press cleaners.

4. The lithographic plate of claim 3 wherein said releasable interlayer is soluble or dispersible in water and comprises a water-soluble polymer selected from the group consisting of polyvinyl alcohol, polyvinylpyrrolidone, poly (2-ethyl-2-oxazoline), polyethylene glycol, polypropylene glycol, polyvinyl phosphonic acid, and gum arabic.

5. The lithographic plate of claim 1 wherein said radiation-sensitive layer is capable of hardening or solubilization upon exposure to an actinic radiation.

6. The lithographic plate of claim 5 further including a water-soluble or water-dispersible top layer on the radiation-sensitive layer.

7. The lithographic plate of claim 5 further including a top infrared laser ablatable mask layer on the radiation-sensitive layer, said radiation-sensitive layer being sensitive to an actinic radiation in ultraviolet and visible region, and said top mask layer being opaque to the actinic radiation.

8. The lithographic plate of claim 1 wherein the non-hardened or solubilized areas of said radiation-sensitive layer is soluble or dispersible in ink (for waterless plate) or in ink and/or fountain solution (for wet plate), and said plate is capable of on-press development with ink and/or fountain solution.

9. The lithographic plate of claim 1 wherein the substrate is hydrophilic; and the radiation-sensitive layer is oleophilic and comprises an oleophilic polymeric binder, a crosslinkable monomer or oligomer with at least one acrylate or methacrylate functional group, and a radiation-sensitive free-radical initiator.

10. The lithographic plate of claim 1 wherein said radiation-sensitive layer is capable of thermal ablation upon exposure to an infrared laser radiation.

11. The lithographic plate of claim 10 wherein said radiation-sensitive layer comprises an infrared light absorbing dye or pigment and a polymeric resin.

12. The lithographic plate of claim 1 wherein said substrate is hydrophilic and said radiation-sensitive layer is oleophilic.

13. The lithographic plate of claim 1 wherein said substrate is oleophilic and said radiation-sensitive layer is oleophobic.

14. The lithographic plate of claim 1 wherein the substrate is a roughened aluminum (including aluminum alloy), selected from the group consisting of electrochemically roughened aluminum, chemically roughened aluminum, and mechanically roughened aluminum.

15. A method of lithographically printing images on receiving media, comprising in order:
    (a) providing a lithographic printing plate comprising (i) a substrate with roughened surface on at least one side, said surface comprising, at least, peaks and valleys; and (ii) a radiation-sensitive layer on said substrate, said radiation-sensitive layer being capable of hardening or solubilization upon exposure to an actinic radiation, the non-hardened or solubilized areas of said radiation-sensitive layer being soluble or dispersible in ink (for waterless plate) or in ink and/or fountain solution (for wet plate), and said radiation-sensitive layer exhibiting an affinity or aversion substantially opposite to the affinity or aversion of said substrate to at least one printing liquid selected from the group consisting of ink and an abhesive fluid for ink; wherein said radiation-sensitive layer is substantially conformally coated on the substrate surface so that the surface of the radiation-sensitive layer has peaks and valleys substantially corresponding to the major peaks and valleys of the substrate microscopic surface; and said substrate has an average surface roughness Ra of about 0.2 to about 2.0 microns, the radiation-sensitive layer has a coverage of about 0.1 to about 2.0 $g/m^2$, and the average height of the valleys on the radiation-sensitive layer surface is at least 0.1 microns below the average height of the peaks of radiation-sensitive layer surface;

(b) exposing the plate with an actinic radiation to cause hardening or solubilization of the exposed areas; and (c) contacting said exposed plate with ink (for waterless plate), or with ink and/or fountain solution (for wet plate) on a printing press to develop the radiation-sensitive layer, and to lithographically print images from said plate to the receiving media.

16. The method of claim 15 wherein said substrate is hydrophilic; and the radiation-sensitive layer is oleophilic, comprises an oleophilic polymeric binder, a crosslinkable monomer or oligomer with at least one acrylate or methacrylate functional group, and a radiation-sensitive free-radical initiator, and is soluble or dispersible in ink and/or fountain solution.

17. The method of claim 15 wherein the lithographic plate further including a water and/or ink soluble or dispersible interlayer interposed between the radiation-sensitive layer and the roughened substrate, wherein said roughened substrate is capable of mechanical interlocking with a coating deposited thereon, and said releasable interlayer is substantially conformally coated on the substrate microscopic surface and is thin enough in thickness to allow mechanical interlocking between the radiation-sensitive layer and the substrate.

18. The method of claim 15 wherein said plate is imagewise exposed with an actinic radiation while mounted on the plate cylinder of a lithographic press.

* * * * *